United States Patent
Laming et al.

(10) Patent No.: US 8,841,737 B2
(45) Date of Patent: Sep. 23, 2014

(54) MEMS DEVICE AND PROCESS

(75) Inventors: Richard Ian Laming, Edinburgh (GB); Colin Robert Jenkins, Livingston (GB)

(73) Assignee: Wolfson Microelectronics plc, Edinburgh (GB)

( * ) Notice: Subject to any disclaimer, the term of this patent is extended or adjusted under 35 U.S.C. 154(b) by 653 days.

(21) Appl. No.: 12/678,884

(22) PCT Filed: Sep. 18, 2008

(86) PCT No.: PCT/GB2008/003165
§ 371 (c)(1),
(2), (4) Date: May 12, 2010

(87) PCT Pub. No.: WO2009/037458
PCT Pub. Date: Mar. 26, 2009

(65) Prior Publication Data
US 2010/0308425 A1 Dec. 9, 2010

(30) Foreign Application Priority Data
Sep. 19, 2007 (GB) .................................. 0718305.6

(51) Int. Cl.
H01L 29/84 (2006.01)
H01L 21/306 (2006.01)
B81B 3/00 (2006.01)
H04R 19/00 (2006.01)

(52) U.S. Cl.
CPC ............ B81B 3/0072 (2013.01); H04R 19/005 (2013.01); *B81B 2201/0257* (2013.01)
USPC ............................................ 257/416; 438/53

(58) Field of Classification Search
USPC ............................................ 257/416; 438/53
See application file for complete search history.

(56) References Cited

U.S. PATENT DOCUMENTS

| 4,784,721 A | 11/1988 | Holmen et al. |
| 6,535,460 B2 * | 3/2003 | Loeppert et al. ............... 367/181 |
| 6,677,176 B2 * | 1/2004 | Wong et al. ..................... 438/50 |
| 2002/0053242 A1 | 5/2002 | Tai et al. |
| 2007/0165888 A1 | 7/2007 | Weigold |
| 2009/0108381 A1 * | 4/2009 | Buchwalter et al. .......... 257/415 |

FOREIGN PATENT DOCUMENTS

| DE | 196 07 379 A1 | 9/1996 |
| GB | 2 435 544 A | 8/2007 |
| WO | WO 01/00523 A1 | 1/2001 |
| WO | WO 02/12925 A2 | 2/2002 |
| WO | WO 02/15636 A2 | 2/2002 |

OTHER PUBLICATIONS

M. Pedersen et al., "A silicon condenser microphone with polymide diaphragm and backplate," *Sensors and Actuators A*, vol. 63, No. 2, p. 97-104, Oct. 30, 1997.

* cited by examiner

*Primary Examiner* — Robert Carpenter
(74) *Attorney, Agent, or Firm* — Dickstein Shapiro LLP (57) ABSTRACT

A MEMS comprises a back-plate (7) having an inner portion (7a) and an outer portion (7b), the inner portion (7a) connected to the outer portion (7b) by a sidewall (7c). A raised section or anchor ring (60) is formed in the outer portion (7b) of the back-plate, in a region of the back-plate near the inner perimeter of the outer portion. The anchor ring may comprise angled sidewalls. The thickness of the back-plate may be greater than the thickness of the material supporting the anchor ring. Embodiments are also disclosed in which a membrane comprises a raised portion and an outer portion connected by an angled sidewall.

41 Claims, 7 Drawing Sheets

PRIOR ART

Figure 1

PRIOR ART

Figure 2

PRIOR ART

MEMS DEVICE AND PROCESS

FIELD OF THE INVENTION

This invention relates to a micro-electro-mechanical system (MEMS) device and process, and in particular to a MEMS device and process relating to a transducer, for example a capacitive microphone.

BACKGROUND OF THE INVENTION

Consumer electronics devices are continually getting smaller and, with advances in technology, are gaining ever increasing performance and functionality. This is clearly evident in the technology used in consumer electronic products such as mobile phones, laptop computers, MP3 players and personal digital assistants (PDAs). Requirements of the mobile phone industry for example, are driving the components to become smaller with higher functionality and reduced cost. It is therefore desirable to integrate functions of electronic circuits together and combine them with transducer devices such as microphones and speakers.

The result of this is the emergence of micro-electrical-mechanical-systems (MEMS) based transducer devices. These may be, for example, capacitive transducers for detecting and/or generating pressure/sound waves or transducers for detecting acceleration. There is a continual drive to reduce the size and cost of these devices through integration with the electronic circuitry necessary to operate and process the information from the MEMS through the removal of the transducer-electronic interfaces. One of the challenges in reaching these goals is the difficulty of achieving compatibility with standard processes used to fabricate complementary-metal-oxide-semiconductor (CMOS) electronic devices during manufacture of MEMS devices. This is required to allow integration of MEMS devices directly with conventional electronics using the same materials and processing machinery.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of transducers, the device is driven by a potential difference provided across the electrodes.

Figure 1:
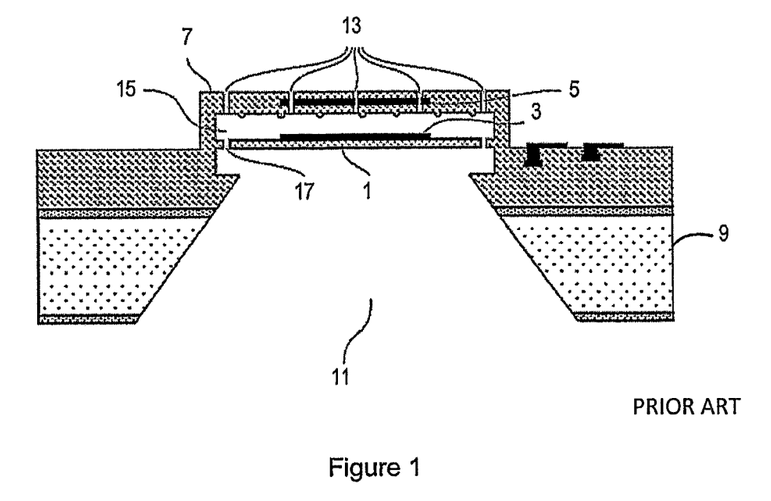
FIG. 1 shows a cross-sectional view of a prior art MEMS microphone.
Figure 2:
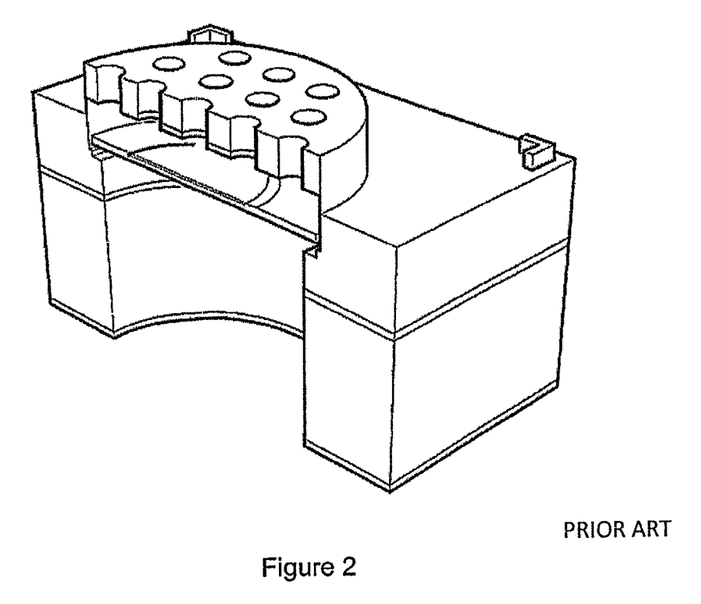
FIG. 2 is a distorted cross-sectional perspective view of the MEMS microphone shown in FIG. 1.

FIGS. 1 and 2 show a schematic diagram and a perspective view, respectively, of a known capacitive microphone device. The capacitive microphone device comprises a flexible membrane 1 that is free to move in response to pressure differences generated by sound waves. A first electrode 3 is mechanically coupled to the flexible membrane 1, and together they form a first capacitive plate of the capacitive microphone device. A second electrode 5 is mechanically coupled to a generally rigid structural layer or back-plate 7, which together form a second capacitive plate of the capacitive microphone device.

The capacitive microphone is formed on a substrate 9, for example a silicon wafer. A back-volume 11 is provided below the membrane 1, and is formed using a "back-etch" through the substrate 9. A plurality of openings 13, referred to hereinafter as acoustic holes, are provided in the back-plate 7 so as to allow free movement of air molecules, such that the sound waves can enter a cavity 15 above the membrane 1. A plurality of openings 17, hereinafter referred to as bleed holes, may be provided for connecting the cavity 15 with the back-volume 11. The cavity 15 and back-volume 11 allow the membrane 1 to move in response to the sound waves entering via the acoustic holes 13 in the back-plate 7.

Thus, in response to a sound wave corresponding to a pressure wave incident on the microphone, the membrane 1 is deformed slightly from its equilibrium position. The distance between the lower electrode 3 and the upper electrode 5 is correspondingly altered, giving rise to a change in capacitance between the two electrodes that is subsequently detected by electronic circuitry (not shown).

FIG. 2 shows a distorted perspective view of the MEMS device illustrated in FIG. 1.

Figure 3:
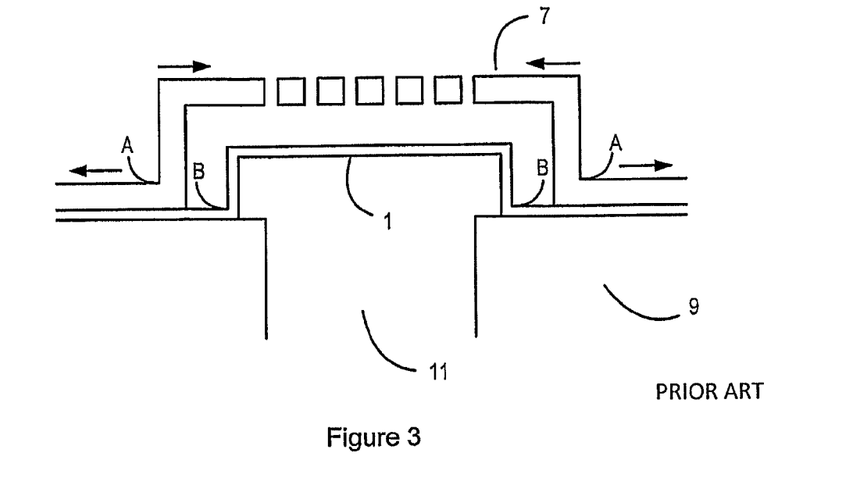
FIG. 3 is a simplified diagram showing a cross-sectional view of a basic MEMS structure.

FIG. 3 shows a simplified cross-sectional view of a conventional MEMS device such as that shown in FIGS. 1 and 2. As mentioned above, a first electrode (not shown) forms part of the flexible membrane 1, and a second electrode (not shown) is attached to or embedded in the rigid back-plate 7 above the membrane 1. Both the back-plate 7 and the membrane 1 may be formed from silicon nitride, for example, and the substrate from silicon. However, the thermal expansion coefficient of silicon is greater than that of silicon nitride and this leads to stresses at the interface between the two dissimilar materials.

The structure of FIG. 3 is formed by various processes of depositing layers and then selectively dry or wet etching portions of the layers away again. This typically involves the use of sacrificial layers or portions which can be removed during subsequent processing steps. These processes take place at relatively low temperatures (in the order of 10-400° C.). When the layers are deposited, there are no intrinsic stress concentrations in the structure. When the structure is released by removal of the sacrificial layers the tensile stress of the deposited layer causes a torsional moment in the back-plate sidewall. This leads to a tensile stress concentration on the outer sidewall edge and a compressive stress concentration on the inner sidewall edge. A similar stress can be found in the membrane 1.

These stress concentrations tend to cause cracking that originates at the points labelled A and B in FIG. 3, and can lead to failure of the MEMS device. This stress can also render the MEMS device more susceptible to failure during fabrication. For example, when multiple MEMS devices are fabricated on a single wafer and subsequently separated using a technique known as singulation or dicing, the stress at points A and B can cause the device to crack and fail. After failure at these points, the transducer is rendered useless.

It is therefore an aim of the present invention to provide a MEMS device that does not suffer from the disadvantages mentioned above.

SUMMARY OF THE INVENTION

According to the present invention, there is provided a micro-electrical-mechanical system (MEMS) device comprising: a layer, the layer comprising: an outer portion; an inner portion raised relative to the outer portion; and a sidewall for connecting the inner portion and the outer portion; wherein an upper surface of the outer portion is higher than a lower surface of the inner portion.

According to another aspect of the present invention, there is provided a micro-electrical-mechanical system (MEMS) device comprising: a layer, the layer comprising: a lower portion; an upper portion spaced apart from the lower portion; a sidewall for supporting the upper portion on the lower portion; wherein the thickness of the lower portion is greater than the step height from the lower portion to the upper portion.

According to another aspect of the present invention, there is provided a method of fabricating a micro-electrical-mechanical system (MEMS) device comprising a first layer, the first layer having an inner portion, an outer portion, and a sidewall for connecting the inner portion and the outer portion, the method comprising the steps of: depositing a sacrificial layer having a first thickness ($t_{step}$); shaping the sacrificial layer to leave a portion of sacrificial material that defines the inner portion of the first layer; depositing the first layer over the sacrificial layer, the first layer having a second thickness ($t_{layer}$); wherein the second thickness ($t_{layer}$) is greater than the first thickness($t_{step}$).

According to another aspect of the present invention, there is provided a micro-electrical-mechanical system (MEMS) device comprising: a membrane layer; a back-plate layer formed over the membrane layer, the back-plate layer comprising: an outer portion; an inner portion raised relative to the outer portion and spaced apart from the membrane layer; and a sidewall for connecting the inner portion and the outer portion; wherein the outer portion of the back-plate layer comprises a raised section formed therein.

According to another aspect of the present invention, there is provided a method of fabricating a micro-electrical-mechanical system (MEMS) device comprising a back-plate layer, the back-plate layer having an inner portion, an outer portion, and a sidewall for connecting the inner portion and the outer portion, the method comprising the steps of: depositing an etchable layer; shaping the etchable layer to leave a ring of etchable material in an area where the outer portion of the back-plate layer is to be deposited; depositing the back-plate layer over the etchable material to form a raised section in the outer portion of the back-plate layer.

BRIEF DESCRIPTION OF THE DRAWINGS

For a better understanding of the invention, and to show more clearly how it may be carried into effect, reference will now be made, by way of example only, to the accompanying drawings in which.

DETAILED DESCRIPTION OF THE PREFERRED EMBODIMENT

In the description of the embodiments described below, it is noted that any dimensions (both written and illustrated) are provided as examples only. Furthermore, any references to stress values and targets are intended to refer to the resultant layer/feature stresses for the fully processed MEMS device, and are provided as examples only.

Figure 4:
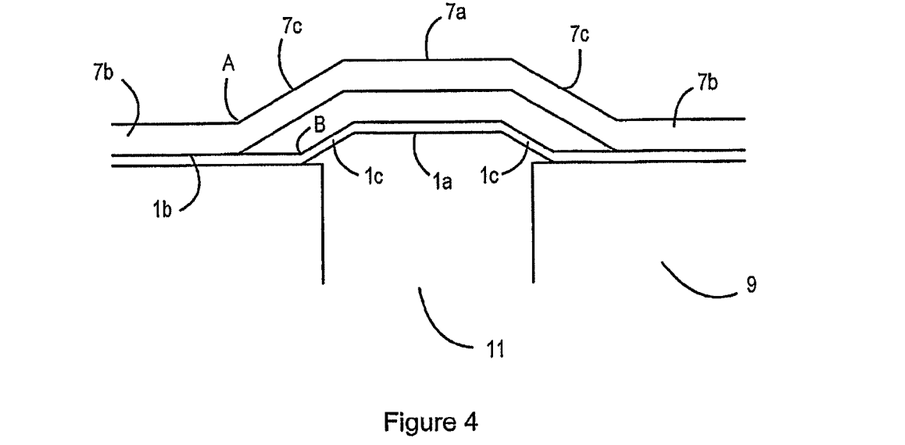
FIG. 4 is a cross-sectional view of a MEMS structure.

FIG. 4 shows a cross-section of a MEMS device. As with FIG. 3, the MEMS device comprises a membrane layer 1 supported on a substrate 9, and a back-plate layer 7 positioned over the membrane layer 1. However, unlike the MEMS device of FIG. 3, the back-plate layer 7 and membrane 1 are formed with slanted or angled sidewalls in order to reduce stress concentrations in the MEMS device, as explained in greater detail below.

The back-plate layer comprises a lower portion 7b supported by the membrane layer 1, (the "lower portion" being an outer portion of the back-plate). The back-plate layer also comprises an upper portion 7a for supporting an electrode (not shown), the "upper portion" being an inner portion of the back-plate. The upper portion 7a of the back-plate layer is spaced apart from the membrane layer 1, and connected to the lower portion 7b via a sidewall 7c. However, rather than being orthogonal to the lower portion 7b, the sidewall 7c of the back-plate is non-orthogonal to the lower portion 7b. The sidewall 7c is therefore slanted or angled such that the maximum stress at corner A is reduced compared to the structure of FIG. 3.

The membrane layer 1 is also slanted in a similar manner to the back-plate layer 7. The membrane layer thus comprises an upper (or inner) portion 1a for supporting an electrode (not shown). The upper portion 1a of the membrane layer is supported by a lower (or outer) portion 1b via a sidewall 1c. However, rather than being orthogonal to the lower portion 1b, the sidewall 1c of the membrane is non-orthogonal to the lower portion 1b. The sidewall 1c is therefore slanted or angled such that the maximum stress at corner B is reduced compared to the structure of FIG. 3.

Where the MEMS device has a substantially circular cross-section (such as the device shown in FIG. 2), the inner portions and sidewalls of the membrane layer 1 and back-plate layer 7 each form a hollow frustum. However, it will be appreciated that it is not necessary for the MEMS device to have a circular cross-section.

The membrane 1 of FIG. 4 is formed in a similar manner to the membrane of FIG. 3, using a series of fabrication steps whereby a sacrificial layer is first deposited on the substrate layer 9 in an area that is to form the upper portion 1a of the membrane layer 1, the sacrificial layer then being removed after the membrane layer has been deposited. However, to obtain the slanted or angled sidewall 1c, the method of fabricating the membrane comprises the steps of depositing a sacrificial layer, and shaping the sacrificial layer to leave a portion of sacrificial material that defines the inner portion of the membrane layer, wherein the edges of the portion of sacrificial material are sloped. The membrane layer is then deposited conformally over the sacrificial layer, thereby creating the slanted or angled sidewall 1c in the membrane layer 1.

Figure 5A:
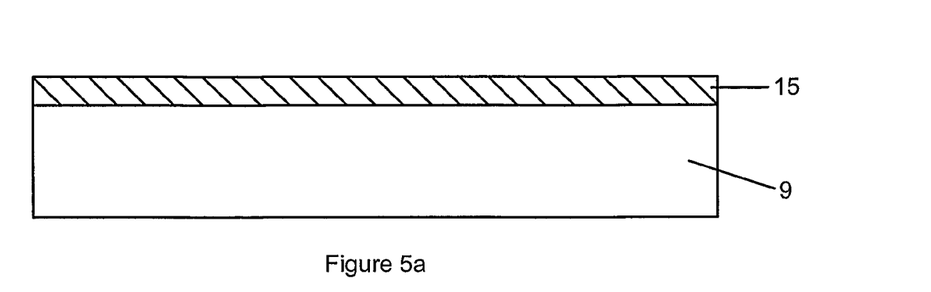
FIGS. 5a to 5d show how the slanted sidewalls in FIG. 4 may be formed according to one method.
Figure 5B:
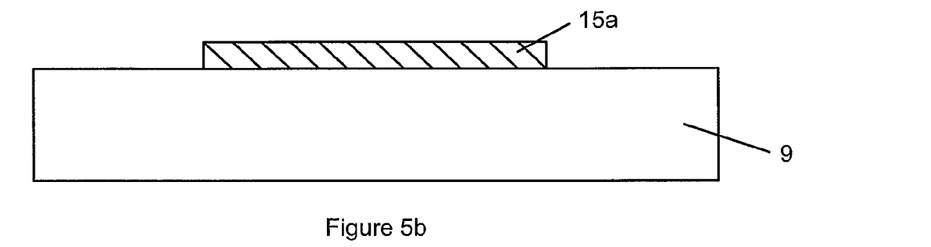
Figure 5C:
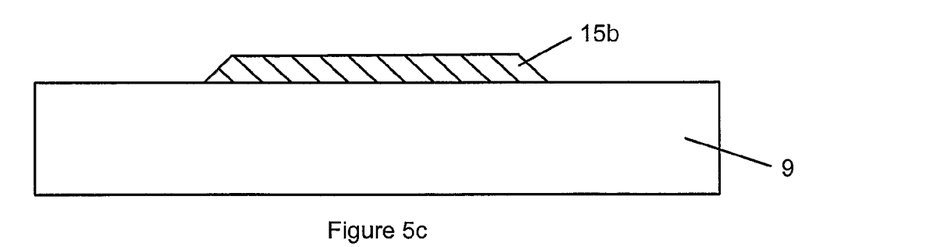
Figure 5D:
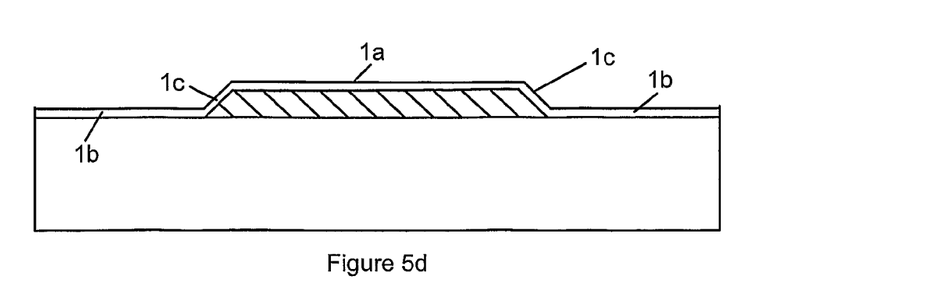

Further details of how to obtain the portion of sacrificial material having sloped edges can be found in co-pending application, filed as Great Britain Patent Application No. 0718308.0, which corresponds to WO 2009/037456 A2 and U.S. Patent Application Publication No. 2010/0244162. Referring to FIGS. 5a to 5d, according to one method, the sloped edges in the portion of sacrificial material are obtained by first depositing a sacrificial layer 15 over the substrate 9 (as shown in FIG. 5a), and then etching the sacrificial layer 15 to leave an intermediate portion of sacrificial material 15a (as shown in FIG. 5b). The intermediate portion of sacrificial material 15a is then thermally treated, for example cured, to form the portion of sacrificial material 15b comprising sloped edges (as shown in FIG. 5c). The sloped edges are formed as a result of shrinkage in the intermediate portion of sacrificial material 15a, whereby the upper surface of the intermediate portion 15a is able to shrink more freely in a horizontal direction compared to the lower surface of the intermediate portion 15a, the lower surface being constrained due to the fact that it is in contact with the substrate 9. The membrane layer is then deposited conformally over the sacrificial layer, thereby creating the slanted or angled sidewall 1c in the membrane layer 1 (as shown in FIG. 5d).

Alternatively the sacrificial layer 15, for example polyimide layer, can be photosensitive i.e. allowing direct patterning by UV exposure. In this case the sacrificial layer 15 is spun on at the required thickness, prebaked at typically 150 degrees C. and exposed. The sacrificial layer is then developed to remove the non-desired polyimide. A final cure at an elevated temperature, for example 350-450 degrees C. for 30 minutes, ensures full solvent evaporation and cross-linking for the material, with material shrinkage during this step giving rise to the angled sidewall.

Figure 6A:
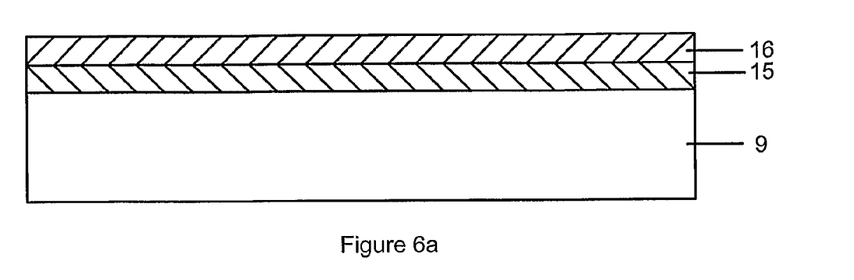
FIGS. 6a to 6d show how the slanted sidewalls in FIG. 4 may be formed according to another method.
Figure 6B:
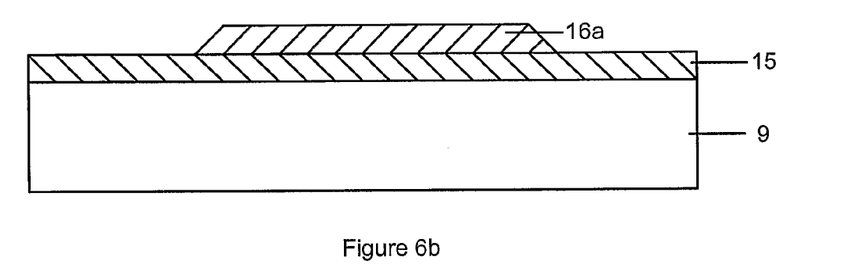

According to another method, the portion of sacrificial material having sloped edges can be formed using the method shown in FIGS. 6a to 6d. First, a resist layer 16, for example a photoresist layer, is deposited over a sacrificial layer 15 (as shown in FIG. 6a). The photoresist layer 16 is then exposed with a pattern, developed and thermally treated, leaving a portion of photoresist material 16a (as shown in FIG. 6b). This results in the portion of photoresist material 16a having sloped edges, caused by shrinkage of the photoresist layer during the formation of the portion 16a. In other words, in a similar manner to that described above, the sloped edges are formed in the portion 16a as a result of shrinkage in the photoresist layer, whereby an upper surface of an intermediate portion of photoresist material is able to shrink in a horizontal direction, whereas a lower surface is constrained from shrinking due to the fact that it is in contact with the sacrificial layer 15.

Figure 6C:
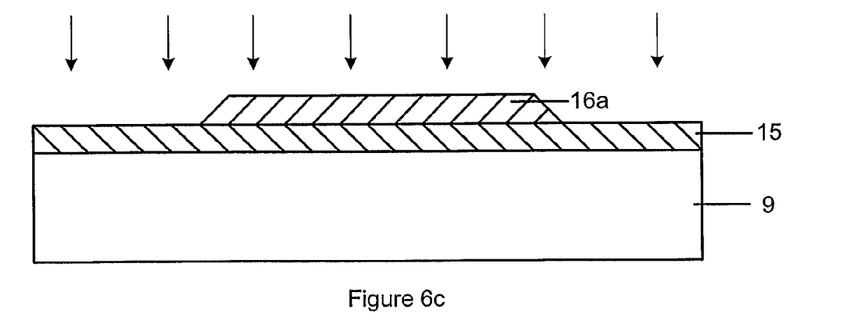

After the portion of photoresist material 16a has been formed, both the sacrificial layer 15 and portion of photoresist material 16a are subjected to an etching process, for example a plasma etch (as shown in FIG. 6c). The sacrificial layer 15 and portion of photoresist material 16a are etched concurrently. Initially, the area of sacrificial material under the portion of photoresist material 16a will not be etched. However, as the etching material penetrates downwards through the outer regions of the sacrificial layer and the portion of photoresist material 16a, the inner area of the sacrificial layer will begin to be etched as the sloped sidewall of the portion of photoresist material 16a is etched away.

Figure 6D:
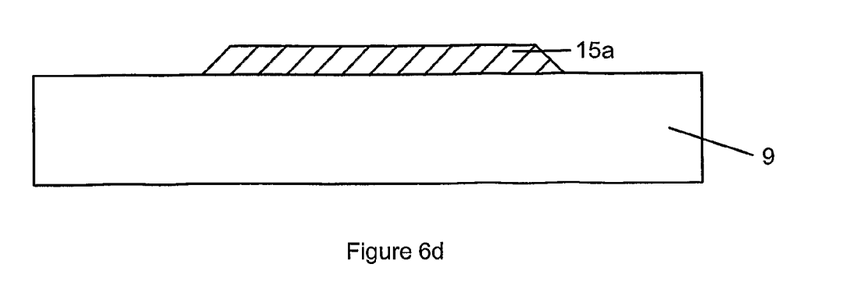

This results in the shape of the portion of photoresist material 16a being substantially transferred to the sacrificial layer 15, thus resulting in the portion of sacrificial material 15a having sloped edges.

It is noted that the thicknesses of the photoresist layer 16 and the sacrificial layer 15 can be chosen according to their respective etch rates. For example, if the sacrificial layer 15 and photoresist layer 16 are made from materials that etch away at the same rate, then the two layers can be chosen to have substantially equal thicknesses.

However, if the photoresist layer is made from a material that etches away at a greater rate than the material of the sacrificial layer, then the photoresist layer can be made thicker, and vice versa.

According to one example for realising the above method, a polyimide layer is spun on to the substrate to the required thickness. The polyimide layer may comprise a thermally cured polyimide material, which is thermally cured after being deposited with a maximum cure temperature of about 350 degrees C. A photoresist material, for example Shipley SPR 220-7, is spun on to a thickness of about 8 microns. The photoresist material is then exposed with the desired pattern, developed and thermally treated to give a photoresist portion having sloped sidewalls, for example with a 70 degree angle. The resultant shape of the photoresist portion is then etched into the polyimide, for example using a plasma etcher such as an RIE80 and oxygen plasma. As a result the sloped sidewall in the photoresist portion is transferred into the polyimide.

An alternative method of producing the sloped sidewalls of the membrane layer is to use a "greyscale" etching mask. That is, conventionally a sacrificial layer is patterned by placing a mask conforming to the desired pattern over the sacrificial layer. Etchant is then applied to the device and, due to the mask, only the areas open to the etchant are etched away. A greyscale etching mask, however, in addition to "open" areas, where the sacrificial layer is to be completely etched away, and "closed" areas, where no etching is to take place, has "grey" areas comprising apertures of varying size and number. Etchant passes through these apertures and on to the sacrificial layer at a rate that is determined by the number of apertures and/or their size. Thus, a grey area over a sacrificial layer that is to be nearly completely etched away will have a greater number of, and/or larger apertures than a grey area over a sacrificial layer that is to be less aggressively etched.

Thus, the sloped sidewalls may be created by using a greyscale etching mask with a smoothly varying number and/or size of apertures.

The back-plate 7 of FIG. 4 is also formed in a similar manner to the back-plate 7 of FIG. 3, using a series of fabrication steps whereby a sacrificial layer is first deposited on the membrane layer in an area under the upper portion 7a of the back-plate layer, the sacrificial layer then being removed after the back-plate layer 7 has been deposited.

However, the angled sidewall 7c in the back-plate is obtained by first depositing a sacrificial layer, and shaping the sacrificial layer to leave a portion of sacrificial material that defines the inner portion of the back-plate layer, wherein the edges of the portion of sacrificial material are sloped. The back-plate layer is then deposited conformally over the sacrificial layer, thereby creating the slanted or angled sidewall 7c in the back-plate layer 1.

The angled sidewall 7c in the backplate layer can be formed using similar techniques to those described above in relation to the formation of the membrane, for example using the technique shown in FIGS. 5a to 5d, 6a to 6d or the grey-scale mask.

It is noted that, although the lower portion 7b of the back-plate layer 7 is shown as being supported directly by the membrane layer 1, the MEMS device may comprise one or more other layers interposed between the back-plate layer and the membrane layer, for example a dielectric layer or an etch stop layer. In a similar manner, although the lower portion 1b of the membrane layer 1 is shown as being supported directly by the substrate layer 9, the MEMS device may comprise one or more other layers interposed between the membrane layer and the substrate layer, for example a dielectric layer or an etch stop layer.

Finally, the MEMS device may be "released" by removing the sacrificial layers (for example by etching) such that the membrane layer 1 is free to move in relation to the back-plate layer 7. Optionally, this step may involve leaving at least part of the sacrificial layer in order to strengthen the structure. For example, a portion of sacrificial material underneath the sidewalls of the membrane and/or the back-plate may be left in order to strengthen the sidewalls and reduce the stress.

It is also noted that the methods described for obtaining sloped sidewalls applies to a MEMS device in which only the membrane or back-plate is fabricated as discussed above.

Figure 7:
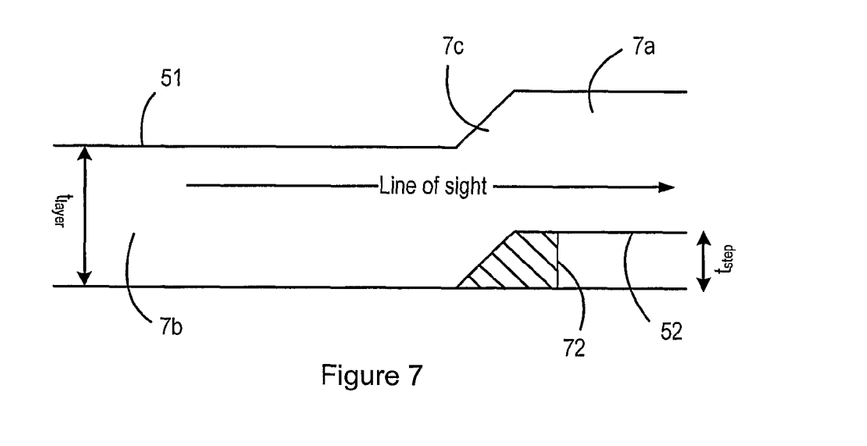
FIG. 7 shows a cross-sectional view of a MEMS device according to a first aspect of the present invention.

FIG. 7 shows a first aspect of the present invention. For simplicity, only one side of the cross-sectional view of the back-plate of the MEMS device is shown. In FIG. 7 the thickness of the back-plate is increased such that an upper surface 51 of the lower portion 7b of the back-plate is higher than a lower surface 52 of the upper portion 7a of the back-plate. The MEMS device is formed in this way by ensuring that the thickness $t_{layer}$ of the back-plate layer is greater than the thickness $t_{step}$ of the sacrificial layer used to create the cavity under the upper portion 7a of the back-plate layer. Thus, the thickness of the back-plate layer is greater than the height of the step in the back-plate layer, and therefore provides a lower torsional moment and improved support for both horizontal and vertical loads.

In one embodiment, the back-plate layer 7 may be further strengthened by leaving part 72 of the sacrificial layer used to create the cavity under the upper portion 7a of the back-plate layer 7. That is, conventionally, the sacrificial layer would be entirely removed such that the membrane (not shown in FIG. 7) is free to move relative to the back-plate. However, in this embodiment, a small part 72 of the sacrificial layer may be left underneath the sidewalls 7c of the back-plate, in order to provide additional support.

Since the thickness of the back-plate layer is greater than the height of the step in the back-plate layer, there exists a horizontal "line of sight" running through the back-plate. This gives both horizontal and vertical support to the back-plate, and has the added advantage of making the back-plate extremely stiff such that an accurate signal can be obtained.

Although shown in relation to a MEMS device having a slanted or angled sidewall 7c, it is noted that this aspect of the invention is also applicable to a MEMS device having a sidewall 7c that is orthogonal to the lower portion 7b. Furthermore, this aspect of the invention is applicable to a membrane layer in the MEMS device, wherein the membrane layer has an upper potion and a lower portion 1b, and having either vertical or angled sidewalls connecting the upper and lower portions.

Figure 8:
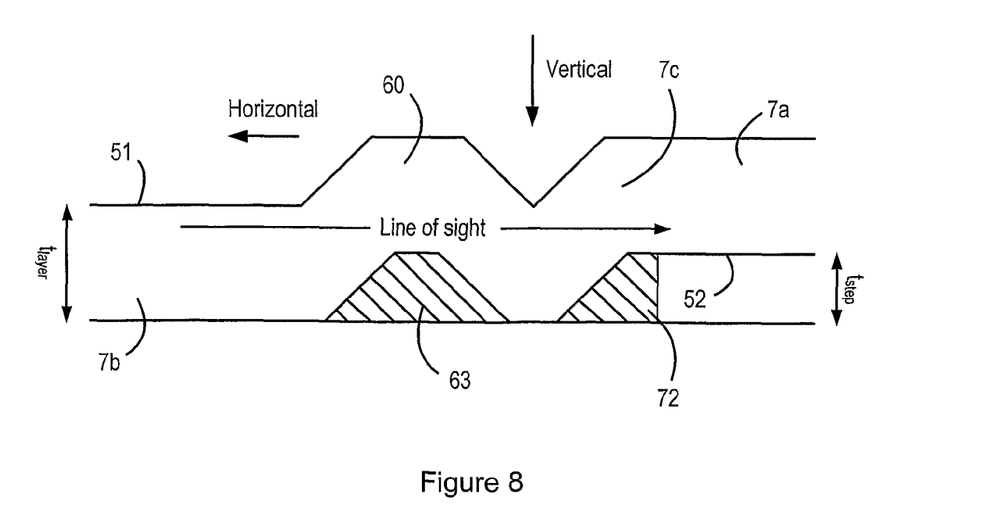
FIG. 8 shows a cross-sectional view of a MEMS device according to a second aspect of the present invention.

FIG. 8 shows a further aspect of the present invention, whereby an anchor region 60 in the form of a ring (in the case of a substantially circular MEMS device as shown in FIG. 2) is provided around the periphery of the back-plate layer, in the region of the back-plate layer corresponding to the lower portion 7b. For simplicity, only one side of the cross-sectional view of the MEMS device is shown.

In this illustrated example, the anchor ring 60 is formed by depositing a ring of material 63 prior to depositing the back-plate layer 7. For example, the ring of material 63 may be formed during the step of depositing the sacrificial layer that is used to create the cavity under the upper portion 7a of the back-plate layer. In other words, when depositing the sacrificial layer that is used to create the cavity under the upper portion 7a of the back-plate layer, the sacrificial layer is etched such that an additional ring 63 is formed as an additional support structure near the sidewall 7c. The presence of the ring 63 causes a protrusion to be formed in the back-plate layer when the back-plate layer is deposited, resulting in the anchor ring 60 shown in FIG. 8. It is noted that, when the sacrificial layer is etched away to create the cavity beneath the upper portion 7a (i.e. after depositing the back-plate layer 7), the ring 63 remains in place since the etch material has no means of contacting the ring 63. Thus, in this embodiment, "sacrificial layer" is a poor moniker as the ring 63 may not actually be sacrificed. Therefore, the sacrificial layer described above may also be referred to as an "etchable layer".

Preferably, the sacrificial layer is deposited using any one of the techniques described above for obtaining angled or sloped sidewalls, thus creating a sloped edge profile to the ring 63.

Figure 9:
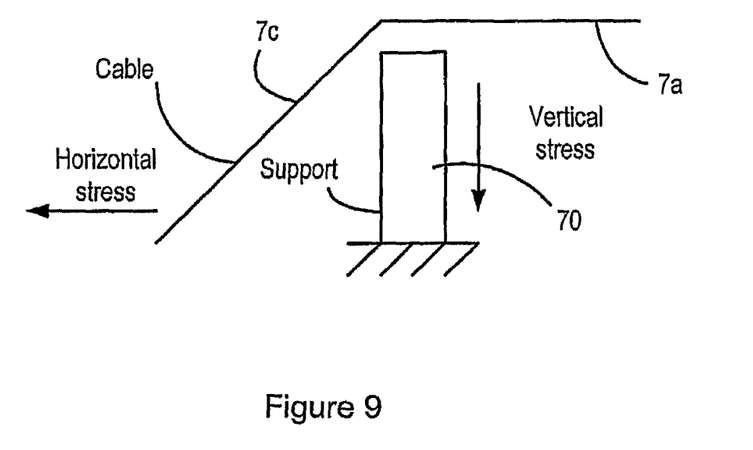
FIG. 9 illustrates the effect of the anchor ring shown in FIG. 8.

The anchor ring described above helps to reduce the stress at the corners (A, B) by dividing the torsional stress into a vertical component and a horizontal component. The principle can be seen elsewhere, for example, in the design of suspension bridges. Towers on either side of a bridge (equivalent to the supporting legs here) take the vertical load, and suspension cables braced over the towers and anchored to the ground on either side take the horizontal load. This is illustrated in FIG. 9, and creates a much stronger structure and reduces the maximum stress which would otherwise be found at the base of the tower 70.

Preferably, the MEMS device according to this aspect of the invention is fabricated such that an upper surface 51 of the lower portion 7b of the back-plate is higher than a lower surface 52 of the upper portion 7a of the back-plate, as described above in relation to FIG. 7. This results in a MEMS device in which the thickness $t_{layer}$ of the back-plate is greater than the thickness $t_{step}$ of the sacrificial layer used to create the cavity under the upper portion of the back-plate layer. In other words, the thickness of the back-plate layer is greater than the step height in the back-plate layer.

In one embodiment, as discussed with respect to FIG. 7, the back-plate layer 7 may be further strengthened by leaving a part 72 of the sacrificial layer used to create the cavity under the upper portion 7a of the back-plate layer 7. That is, conventionally, the sacrificial layer would be entirely removed such that the membrane (not shown in FIG. 7) is free to move relative to the back-plate. However, in this embodiment, a small part 72 of the sacrificial layer may be left underneath the sidewalls 7c of the back-plate, in order to provide additional support.

Optionally, the back-plate deposition using PECVS may be performed in a manner that results in the filling in of the dip, and hence a further increase in strength.

According to a further aspect of the invention, cross-beams may be formed by selectively depositing the sacrificial layer while creating the anchor region, i.e. leaving gaps for the back-plate layer to fill, such that the cross beams are formed. These cross beams reduce the stress further in the sidewalls of the back-plate by providing a greater area of direct connection, or a larger area with "line of sight", between the upper portion of the back-plate 7a and the lower portion of the back-plate 7b through the anchor ring.

Throughout the description above, reference has been made to "upper" and "lower" portions of the membrane and the back-plate. It will be apparent to the reader that these correspond, respectively, to the inner and outer portions of the membrane and the back-plate, relative to the central axis of the device.

The average stress in the structure may be further controlled by adapting the process parameters to reduce the stress. By reducing the average stress below 150 MPa, the failure mode of cracking between the acoustic holes in the back-plate 7 can be overcome. However, there is a limit to which the stress can be reduced, since the back-plate 7 must be sufficiently rigid in order to achieve an accurate signal from the changing capacitance. Therefore, although not being capable of fully preventing cracking alone, the reduction of the average stress can nevertheless contribute towards an improvement in the failure rates, particularly relating to cracking in the vicinity of the acoustic holes of the back-plate.

A person skilled in the art will appreciate that the above description of the preferred embodiments may be applied to any MEMS device, for example a MEMS microphone or a pressure transducer. The invention is also applicable to other MEMS transducers, such as accelerometers having a mass located on the membrane.

Thus, although the embodiments have been described in relation to the membrane moving in response to pressure differences, and in particular pressure differences caused by sound waves, the membrane may also be configured to move in response to absolute pressure.

In addition, it will be appreciated that the MEMS device may include one or more additional layers to those shown in the described embodiments.

Figure 10:
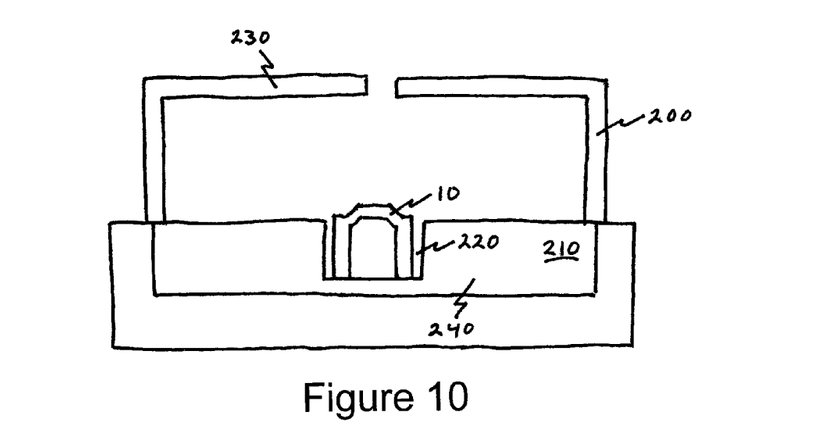
FIG. 10 shows a MEMS device in an electronic package, according to an aspect of the invention.

Furthermore, it is noted that the present invention embraces an electronic package 200 comprising a MEMS transducer 10 as described above and as illustrated in FIG. 10. In addition, the electronic package 200 may comprise a substrate 210 having a recess 220 as defined in co-pending application number GB0716187.0 filed on 17 Aug. 2007, wherein the MEMS transducer 10 is situated in said recess 220. The package 200 may also comprise a lid 230, wherein the package 200 forms an RF cage 240.

Figure 11:
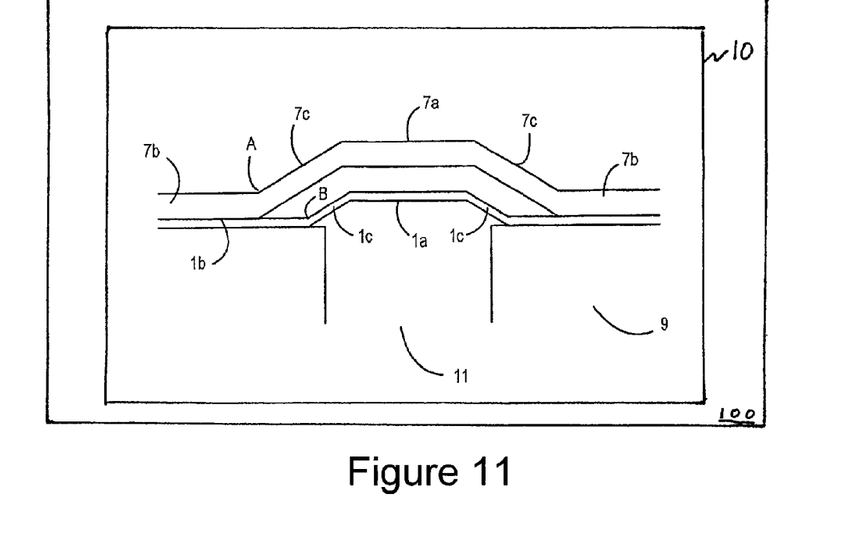
FIG. 11 shows a MEMS device within an additional system or application, according to an aspect of the invention.

It is noted that the invention may be used in a number of applications 100, as illustrated in FIG. 11. These applications 100 include, but are not limited to, consumer applications, medical applications, industrial applications and automotive applications. For example, typical consumer applications include laptops, mobile phones, PDAs and personal computers. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A micro-electrical-mechanical system (MEMS) microphone comprising:
   a rigid back-plate layer;
   a membrane layer, the membrane layer being moveable, in use, in relation to the rigid back-plate layer,
   the back-plate layer comprising:
      an outer portion orientated on a first plane;
      an inner portion orientated on a second plane, wherein the inner portion is raised relative to the outer portion; and
      a sidewall portion orientated on a third place for connecting the inner portion and the outer portion;
      wherein an upper surface of the outer portion is higher than a lower surface of the inner portion
      and wherein the outer portion, inner portion and sidewall portion are configured such that the rigid back-plate layer comprises a fourth plane which is common to the outer portion, inner portion and sidewall portion.

2. A method of fabricating the MEMS microphone of claim 1, the method comprising the steps of:
   depositing an etchable layer;
   shaping the etchable layer to leave a ring of etchable material in an area where the outer portion of the back-plate layer is to be deposited;
   depositing the back-plate layer over the etchable material to form a raised section in the outer portion of the back-plate layer.

3. A method as claimed in claim 2, wherein the shaping step comprises the sub-steps of:
   etching the etchable layer; and
   curing the etchable layer, wherein the step of curing the etchable layer is performed after the step of etching the etchable layer, such that angled sidewalls are formed in the etchable material.

4. A method as claimed in claim 2, wherein the shaping step comprises the sub-step of:
   applying etchant to the etchable layer through a greyscale etching mask, such that angled sidewalls are formed in the etchable material.

5. A method as claimed in claim 2, wherein the shaping step comprises the sub-steps of:
   depositing a resist layer over the etchable layer:
   shaping the resist layer to leave a ring of resist material to define the ring of etchable material, wherein the edges of the ring of resist material are sloped; and
   applying etchant to the etchable material and the ring of resist material, to leave a ring of etchable material having angled sidewalls.

6. A method as claimed in claim 5, wherein the step of shaping the resist layer comprises:
   patterning the resist layer to leave an intermediate ring of resist material; and
   thermally treating the intermediate ring of resist material to form said ring of resist material comprising sloped edges.

7. A method as claimed in claim 5, wherein the step of applying etchant comprises the step of etching away the etchable material and the ring of resist material concurrently, such that the shape of the ring of resist material is substantially transferred to the shape of the ring of etchable material.

8. A method as claimed in claim 5, wherein the resist material comprises a photoresist material.

9. A method as claimed in claim 2, wherein the back-plate layer is deposited having a first thickness ($t_{layer}$), the etchable layer having a second thickness ($t_{step}$), and wherein the first thickness ($t_{layer}$) is greater than the second thickness ($t_{step}$).

10. A method as claimed in claim 2, wherein the step of etching the etchable layer comprises the step of etching a continuous ring of etchable material.

11. A method as claimed in claim 2, wherein the step of etching the etchable layer comprises the step of etching a non-continuous ring of etchable material.

12. A communications device comprising a micro-electrical-mechanical system (MEMS) microphone as claimed in claim 1.

13. A portable telephone device comprising a micro-electrical-mechanical system (MEMS) microphone as claimed in claim 1.

14. A portable telephone device as claimed in claim 13, wherein the MEMS microphone is used in a noise-cancellation process.

15. An audio device comprising a micro-electrical-mechanical system (MEMS) microphone as claimed in claim 1.

16. An audio device as claimed in claim 15, wherein the MEMS microphone is used in a noise-cancellation process.

17. A computer device comprising a micro-electrical-mechanical system (MEMS) microphone as claimed in claim 1.

18. A vehicle comprising a micro-electrical-mechanical system (MEMS) microphone as claimed in claim 1.

19. A medical device comprising a micro-electrical-mechanical system (MEMS) microphone as claimed in claim 1.

20. An industrial device comprising a micro-electrical-mechanical system (MEMS) microphone as claimed in claim 1.

21. A package comprising a MEMS microphone as claimed in claim 1.

22. A package as claimed in claim 21, wherein the electronic package comprises a substrate having a recess, and wherein the MEMS microphone is situated in said recess.

23. A package as claimed in claim 21, wherein the package comprises a lid.

24. A package as claimed in claim 21, wherein the package forms an RF cage.

25. A micro-electrical-mechanical system (MEMS) microphone comprising:
   a rigid back-plate layer;
   a membrane layer, the membrane layer being moveable, in use, in relation to the rigid back-plate layer,
   wherein the rigid back-plate layer comprises:
      a lower portion orientated in a first plane;
      an upper portion orientated in a second plane, the upper portion being spaced apart from the lower portion;
      a sidewall portion orientated in a third plane for supporting the upper portion on the lower portion;
      wherein the thickness of the lower portion is greater than the step height from the lower portion to the upper portion, such that the rigid back-plate layer comprises a fourth plane which is common to the lower portion, upper portion and sidewall portion.

26. A method of fabricating a micro-electrical-mechanical system (MEMS) microphone comprising a rigid back-plate layer and a moveable membrane layer, the back-plate layer having an inner portion orientated in a first plane, an outer portion orientated in a second plane, and a sidewall portion orientated in a third plane for connecting the inner portion and the outer portion, the method comprising the steps of:
   depositing a sacrificial layer having a first thickness ($t_{step}$);
   shaping the sacrificial layer to leave a portion of sacrificial material that defines the inner portion of the back-plate layer;
   depositing the back-plate layer over the sacrificial layer, the back-plate layer having a second thickness ($t_{layer}$);
   wherein the second thickness is greater than the first thickness ($t_{step}$), such that the rigid back-plate layer comprises a fourth plane which is common to the lower portion, upper portion and sidewall portion.

27. A method as claimed in claim 26, wherein the shaping step comprises the sub-step of:
   etching the sacrificial layer through a greyscale etching mask such that the portion of sacrificial material has sloped sidewalls.

28. A method as claimed in claim 26, wherein the shaping step comprises the sub-steps of:
   etching the sacrificial layer; and
   curing the sacrificial layer, wherein the step of curing the sacrificial layer is performed after the step of etching the sacrificial layer.

29. A method as claimed in claim 26, wherein the shaping step comprises the sub-steps of:
   depositing a resist layer over the sacrificial layer:
   shaping the resist layer to leave a portion of resist material to define the portion of sacrificial material, wherein the edges of the portion of resist material are sloped; and
   applying etchant to the sacrificial layer and the portion of resist material, to leave a portion of sacrificial material having sloped sidewalls.

30. A method as claimed in claim 29, wherein the step of shaping the resist layer comprises:
   patterning the resist layer to leave an intermediate portion of resist material; and
   thermally treating the intermediate portion of resist material to form said portion of resist material comprising sloped edges.

31. A method as claimed in claim 29, wherein the step of applying etchant comprises the step of etching away the sacrificial layer and the portion of resist material concurrently, such that the shape of the portion of resist material is substantially transferred to the shape of the portion of sacrificial material.

32. A method as claimed in claim 29, wherein the resist material comprises a photoresist material.

33. A micro-electrical-mechanical system (MEMS) microphone comprising:
   a rigid back-plate layer;
   a membrane layer, the membrane layer being moveable, in use, with respect to the rigid back-plate layer,
   wherein the back-plate layer is formed over the membrane layer, the back-plate layer comprising:
      an outer portion orientated in a first plane;
      an inner portion orientated in a second plane, the inner portion being raised relative to the outer portion and spaced apart from the membrane layer; and
      a sidewall portion orientated in a third plane for connecting the inner portion and the outer portion;
      wherein the outer portion, inner portion and sidewall portion are configured such that the rigid back-plate layer comprises a fourth plane which is common to the outer portion, inner portion and sidewall portion, and
      wherein the outer portion of the rigid back-plate layer comprises a raised section formed therein.

34. A MEMS microphone as claimed in claim 33, wherein the raised section is formed near the inner perimeter of the outer portion of the back-plate.

35. A MEMS microphone as claimed in claim 33, wherein the raised section forms a continuous ring.

36. A MEMS microphone as claimed in claim 33, wherein the raised section forms a non-continuous ring.

37. A MEMS microphone as claimed in claim 33, wherein an upper surface of the raised section is higher than an upper surface of the outer portion.

38. A MEMS microphone as claimed in claim 33, wherein a lower surface of the raised section is higher than a lower surface of the outer portion.

39. A MEMS microphone as claimed in claim 33, wherein the raised section is raised by a first thickness, and wherein the back-plate layer comprises a second thickness, and wherein the first thickness is less than the second thickness.

40. A MEMS microphone as claimed in claim 33, further comprising a layer of other material in the area under the raised section in the outer portion of the back-plate.

41. A MEMS microphone as claimed in claim 33, wherein the raised section has angled sidewalls.

\* \* \* \* \*